(12) United States Patent
Chang et al.

(10) Patent No.: US 9,818,841 B2
(45) Date of Patent: Nov. 14, 2017

(54) SEMICONDUCTOR STRUCTURE WITH UNLEVELED GATE STRUCTURE AND METHOD FOR FORMING THE SAME

(71) Applicant: TAIWAN SEMICONDUCTOR MANUFACTURING CO., LTD., Hsin-Chu (TW)

(72) Inventors: Chai-Wei Chang, New Taipei (TW); Che-Cheng Chang, New Taipei (TW); Po-Chi Wu, Zhubei (TW); Yi-Cheng Chao, Lukang Township, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/713,517

(22) Filed: May 15, 2015

(65) Prior Publication Data
US 2016/0336426 A1 Nov. 17, 2016

(51) Int. Cl.
*H01L 21/336* (2006.01)
*H01L 21/8234* (2006.01)
(Continued)

(52) U.S. Cl.
CPC .... *H01L 29/66545* (2013.01); *H01L 21/3081* (2013.01); *H01L 29/42356* (2013.01); *H01L 29/6656* (2013.01); *H01L 29/66795* (2013.01); *H01L 29/785* (2013.01)

(58) Field of Classification Search
CPC ............. H01L 29/66545; H01L 29/517; H01L 29/42356; H01L 29/4236; H01L 29/6656;
(Continued)

(56) References Cited

U.S. PATENT DOCUMENTS 4,786,360 A 11/1988 Cote et al.
6,093,332 A 7/2000 Winniczek et al.
(Continued)

FOREIGN PATENT DOCUMENTS

DE 102013104744 B3 12/2013
DE 102013215671 A1 3/2014
(Continued)

OTHER PUBLICATIONS

Polishchuk et al., "Dual Work Function Metal Gate CMOS Transistors by Ni—Ti Interdiffusion," IEEE Electron Device Letters, vol. 23, No. 4, Apr. 2002, pp. 200-202.

*Primary Examiner* — Fernando L Toledo
*Assistant Examiner* — Aaron Gray
(74) *Attorney, Agent, or Firm* — Birch, Stewart, Kolasch & Birch, LLP

(57) ABSTRACT

A semiconductor structure and a method for forming the same are provided. The semiconductor structure includes a fin structure formed over a substrate and a gate structure formed across the fin structure. In addition, the gate structure includes a gate dielectric layer formed over the substrate and a work function metal layer formed over the gate dielectric layer. The gate structure further includes a gate electrode layer formed over the work function metal layer. In addition, a top surface of the gate electrode layer is located at a position that is higher than that of a top surface of the gate dielectric layer, and the top surface of the gate dielectric layer is located at a position that is higher than that of a top surface of the work function layer.

19 Claims, 17 Drawing Sheets

(51) Int. Cl.
*H01L 21/3205* (2006.01)
*H01L 29/76* (2006.01)
*H01L 27/088* (2006.01)
*H01L 29/66* (2006.01)
*H01L 21/308* (2006.01)
*H01L 29/78* (2006.01)
*H01L 29/423* (2006.01)

(58) Field of Classification Search
CPC ............. H01L 29/66795; H01L 29/785; H01L 21/3081
USPC ........... 257/288, 392, 401, E29.255, E21.19; 438/592, 197
See application file for complete search history.

(56) References Cited

U.S. PATENT DOCUMENTS

| | | |
|---|---|---|
| 9,012,319 B1 | 4/2015 | Choi et al. |
| 9,209,273 B1 * | 12/2015 | Lin ..................... H01L 29/4232 |
| 9,252,238 B1 * | 2/2016 | Trevino ............ H01L 29/66545 |
| 2007/0259501 A1 | 11/2007 | Xiong et al. |
| 2010/0129984 A1 | 5/2010 | Vakanas et al. |
| 2012/0049279 A1 | 3/2012 | Shrivastava et al. |
| 2013/0161762 A1 | 6/2013 | Kelly et al. |
| 2013/0187236 A1 | 7/2013 | Xie et al. |
| 2014/0048867 A1 | 2/2014 | Toh et al. |
| 2014/0061817 A1 | 3/2014 | Gan et al. |
| 2014/0070320 A1 | 3/2014 | Mukherjee et al. |
| 2014/0203333 A1 * | 7/2014 | Huang ................. H01L 29/4966 257/288 |
| 2015/0145027 A1 * | 5/2015 | Lin .................... H01L 29/66545 257/330 |
| 2015/0206963 A1 | 7/2015 | Ho et al. |
| 2015/0243564 A1 * | 8/2015 | Zhao ................. H01L 29/66545 438/591 |

FOREIGN PATENT DOCUMENTS

DE 102014222289 A1 5/2015
DE 102014019257 A1 7/2015

* cited by examiner

SEMICONDUCTOR STRUCTURE WITH UNLEVELED GATE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
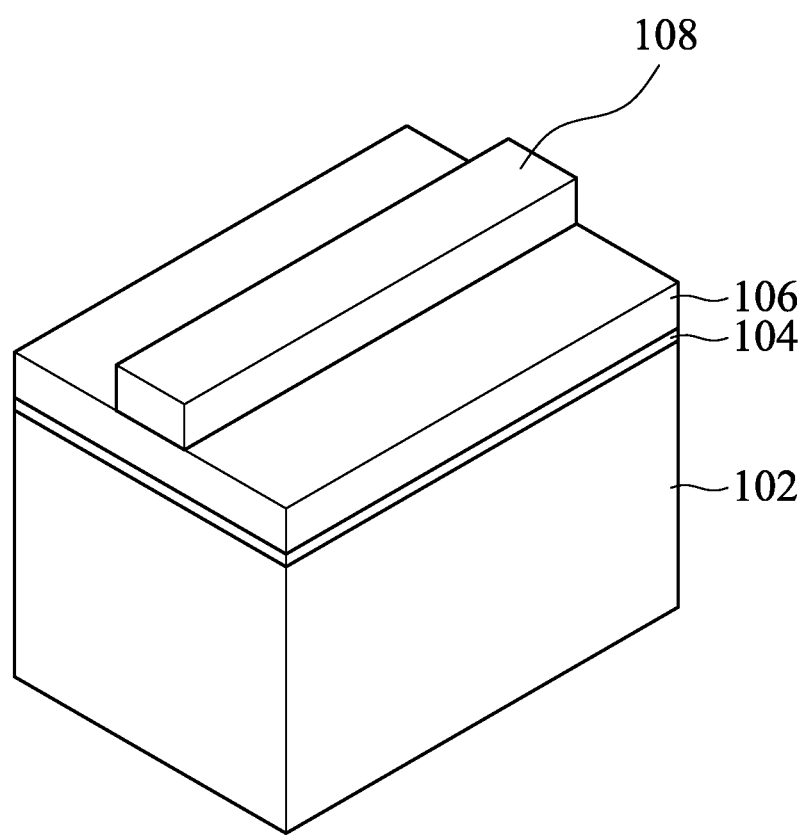
FIGS. 1A to 1L are perspective views of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a gate structure including a gate dielectric layer, a work function metal layer formed over the gate dielectric layer, and a gate electrode layer formed over the work function metal layer. In addition, the top surfaces of the gate dielectric layer, the work function metal layer, and the gate electrode layer are not level.

FIGS. 1A to 1L are perspective views of various stages of forming a semiconductor structure 100 in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 and a mask layer 106 are formed over substrate 102, and a photo-sensitive layer 108 is formed over mask layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Figure 1B:
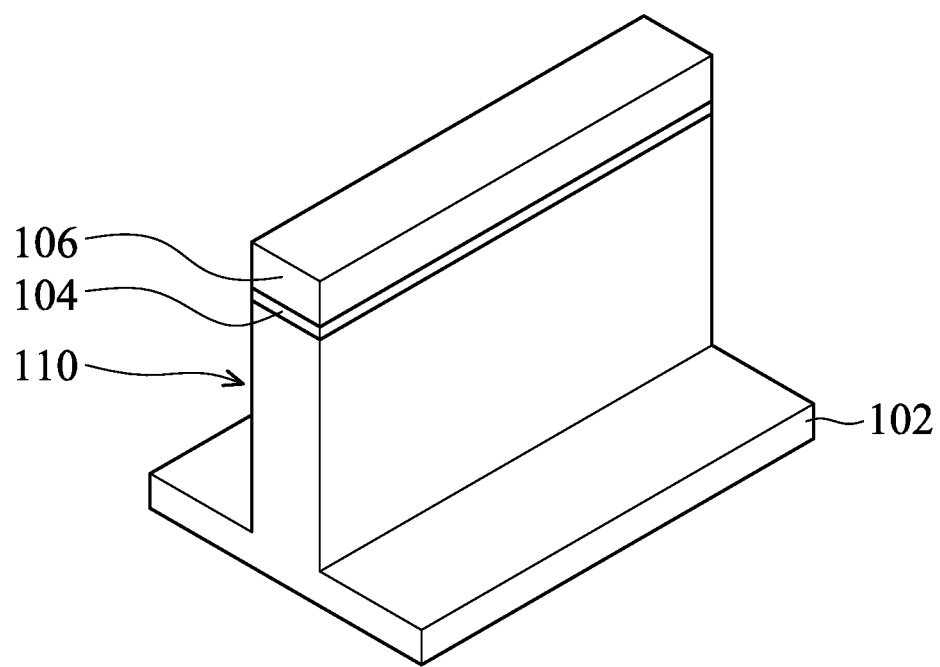

Next, a fin structure 110 is formed by sequentially etching mask layer 106, dielectric layer 104, and substrate 102 through photo-sensitive layer 108, as shown in FIG. 1B in accordance with some embodiments. Afterwards, photo-sensitive layer 108 is removed.

Figure 1C:
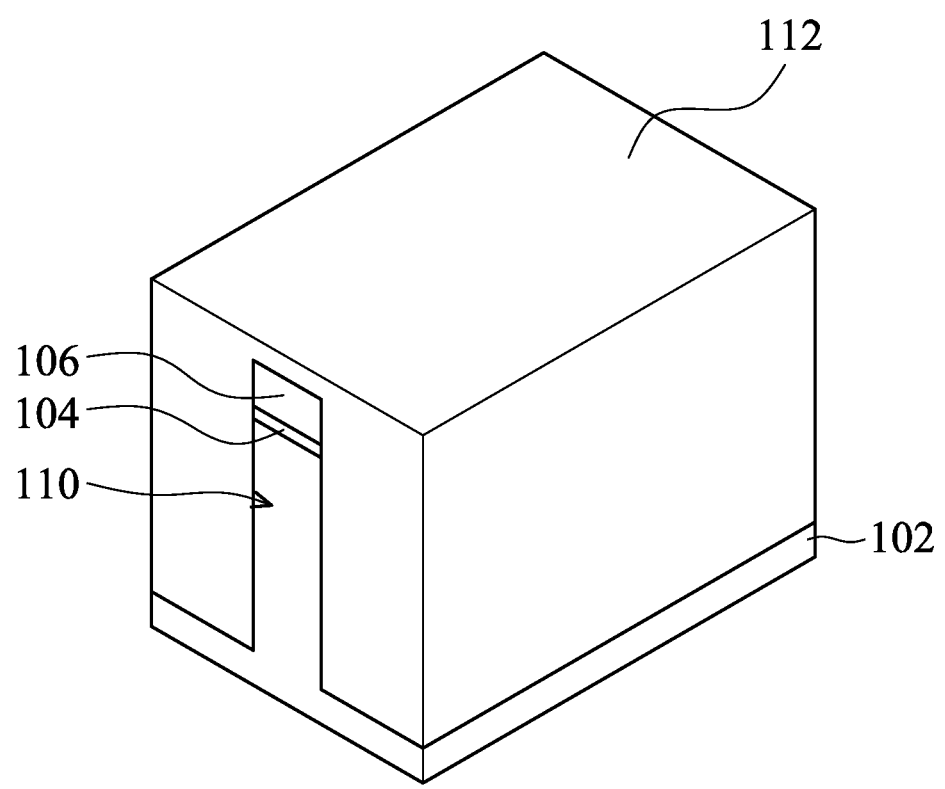

After fin structure 110 is formed, an insulating layer 112 is formed to cover fin structures 110 over substrate 102, as shown in FIG. 1C in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

Figure 1D:
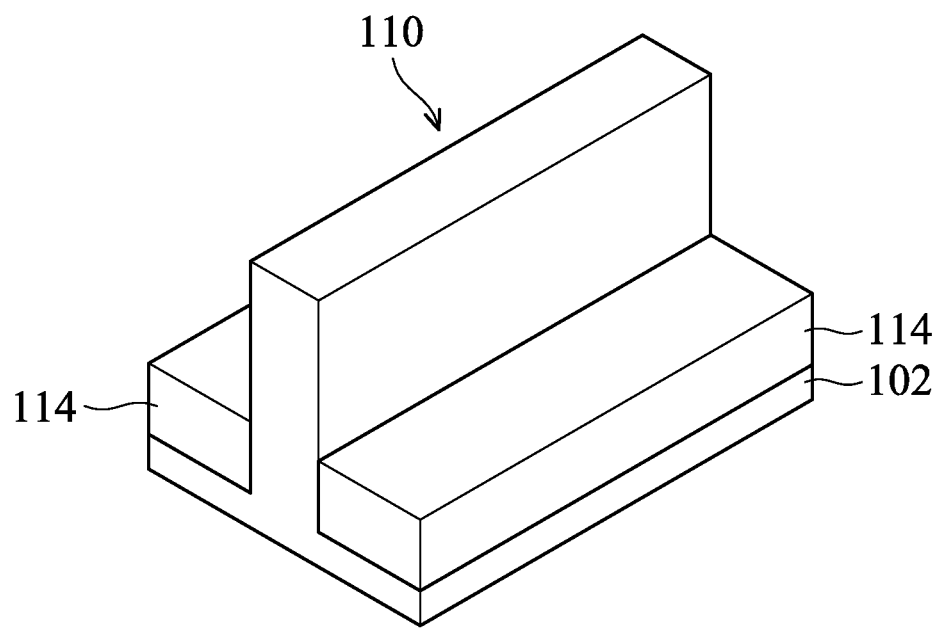

Next, insulating layer 112 is recessed to form an isolation structure 114, such as a shallow trench isolation structure, around fin structure 110, as shown in FIG. 1D in accordance with some embodiments. Insulating layer 112 may be recessed by a wet etching process or a dry etching process. In addition, mask layer 106 and dielectric layer 104 are removed.

Afterwards, a dummy gate structure 116 is formed across fin structure 110 and extends over isolation structure 114. In some embodiments, dummy gate structure 116 includes a dummy gate dielectric layer 118 and a dummy gate electrode layer 120 formed over dummy gate dielectric layer 118. In some embodiments, dummy gate dielectric layer 118 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$-$Al_2O_3$) alloy, or other applicable dielectric materials. In some embodiments, dummy gate electrode layer 120 is made of polysilicon.

After dummy gate structure 116 is formed, spacers 122 are formed on the sidewalls of dummy gate structure 116 in accordance with some embodiments. In some embodiments, spacers 122 are made of silicon nitride, silicon oxide, silicon oxynitride, silicon carbide, or other applicable dielectric materials. Spacers 122 may include a single layer or multiple layers.

Figure 1E:
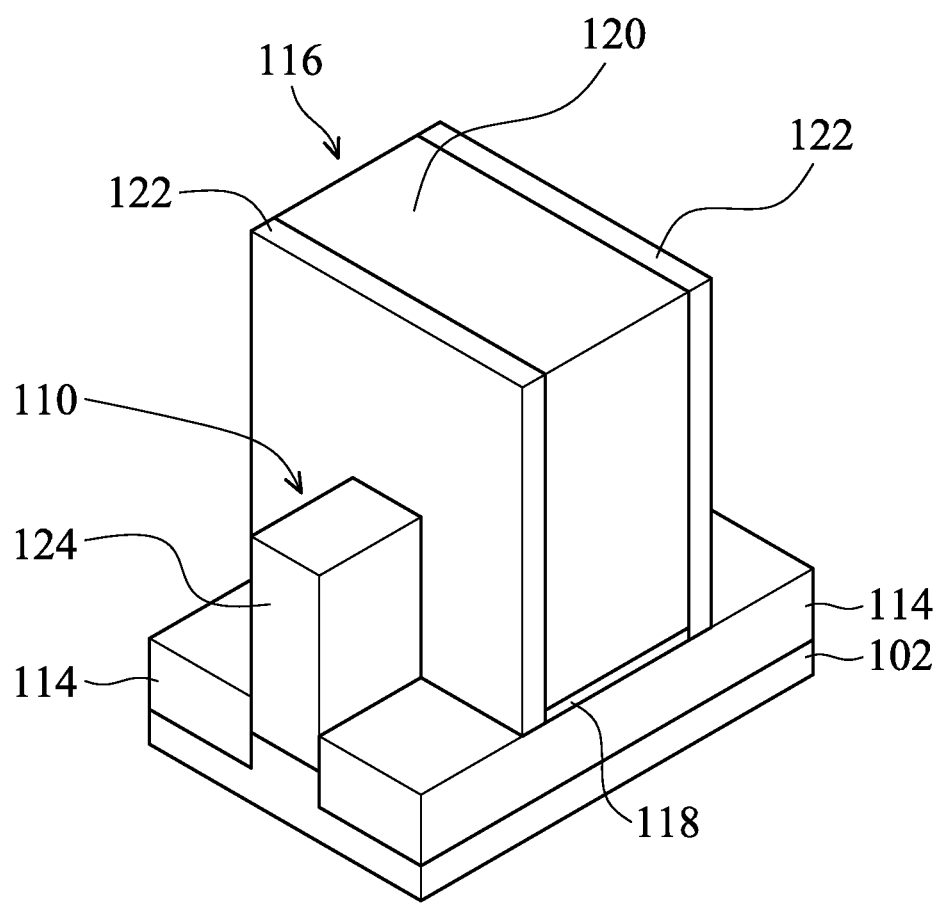

Next, source/drain structures 124 are formed in fin structure 110, as shown in FIG. 1E in accordance with some embodiments. In some embodiments, portions of fin structure 110 adjacent to dummy gate structure 116 are recessed to form recesses at two sides of fin structure 110, and a strained material is grown in the recesses by an epitaxial (epi) process to form source/drain structures 124. In addition, the lattice constant of the strained material may be different from the lattice constant of substrate 102. In some embodiments, source/drain structures 124 include Ge, SiGe, InAs, InGaAs, InSb, GaAs, GaSb, InAlP, InP, or the like.

Figure 1F:
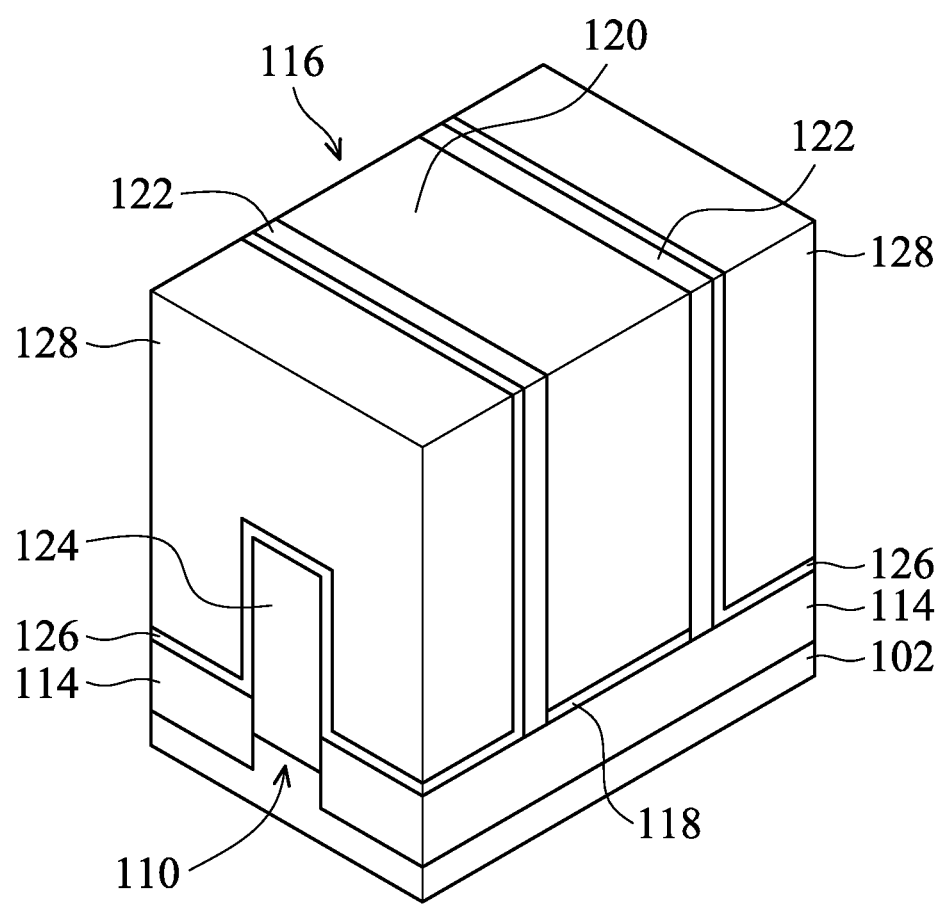

After source/drain structures 124 are formed, a contact etch stop layer (CESL) 126 is formed over substrate 102, and an inter-layer dielectric (ILD) layer 128 is formed over contact etch stop layer 126, as shown in FIG. 1F in accordance with some embodiments. In some embodiments, contact etch stop layer 126 is made of silicon nitride, silicon oxynitride, and/or other applicable materials. Contact etch stop layer 126 may be formed by plasma enhanced CVD, low pressure CVD, ALD, or other applicable processes.

Inter-layer dielectric layer 128 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. Inter-layer dielectric layer 128 may be formed by chemical vapor deposition (CVD), physical vapor deposition, (PVD), atomic layer deposition (ALD), spin-on coating, or other applicable processes.

Next, a polishing process is performed on inter-layer dielectric layer 128 and contact etch stop layer 126 to expose the top surface of dummy gate structure 116 in accordance with some embodiments. In some embodiments, a chemical mechanical polishing (CMP) process is performed until the top surface of dummy gate structure 116 is exposed.

Figure 1G:
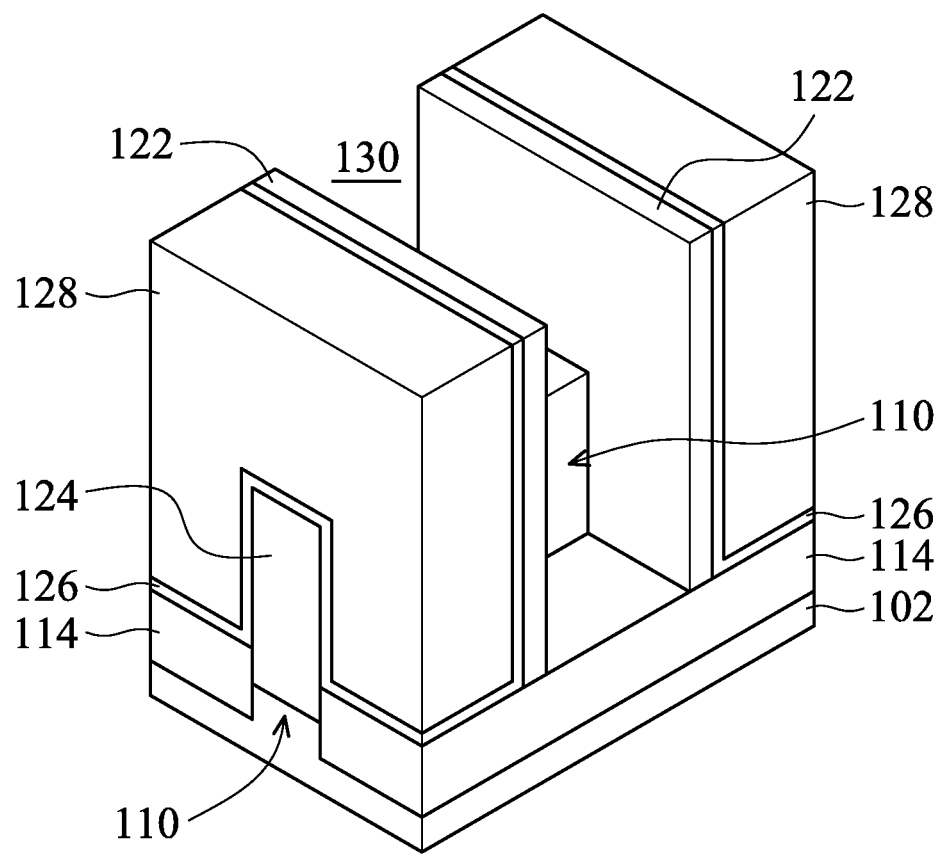

After the polishing process is performed, dummy gate structure 116 is removed, such that a trench 130 is formed, as shown in FIG. 1G in accordance with some embodiments. In some embodiments, dummy gate structure 116 is removed by performing a dry etching process. In some embodiments, dummy gate structure 116 is removed by performing a dry etching process and a wet etching process.

Figure 1H:
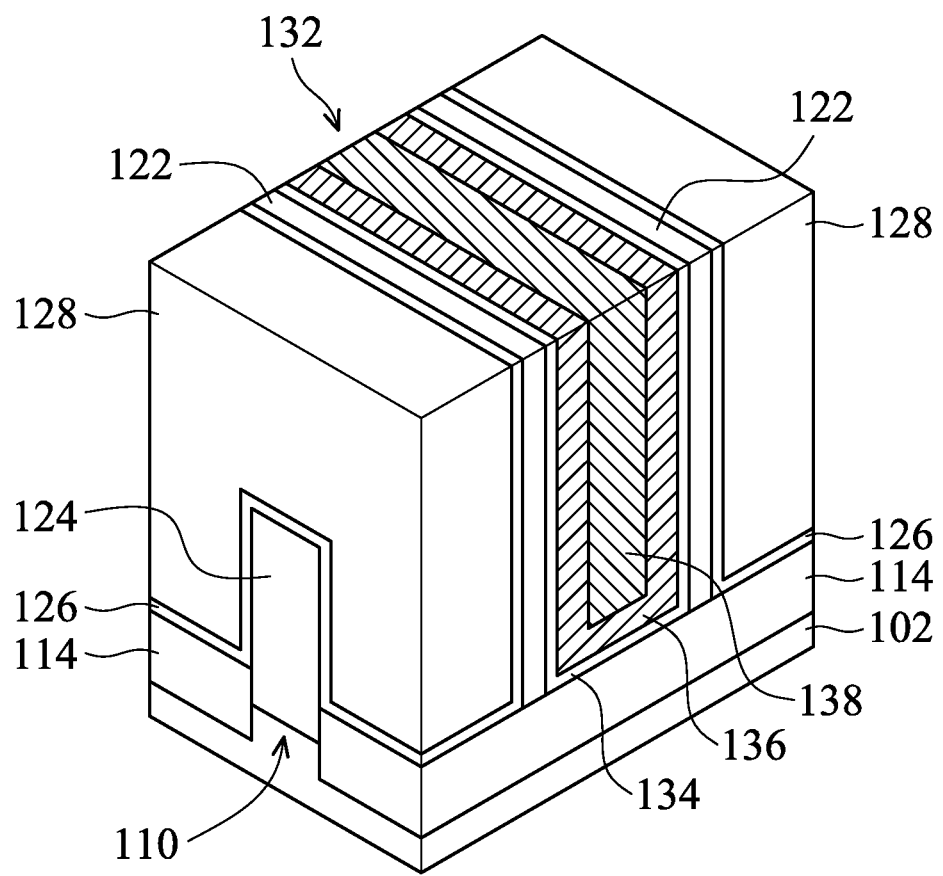

After dummy gate structure 116 is removed, a metal gate structure 132 is formed in trench 130, as shown in FIG. 1H in accordance with some embodiments. In some embodiments, metal gate structure 132 includes a gate dielectric layer 134, a work function metal layer 136, and a gate electrode layer 138. More specifically, gate dielectric layer 134 is formed on the sidewalls and bottom surface of trench 130, and work function metal layer 136 and gate electrode layer 138 are formed over gate dielectric layer 134 afterwards. As shown in FIG. 1F, at this stage of the manufacturing process, the top surfaces of gate dielectric layer 134, work function metal layer 136, and gate electrode layer 138 are level.

In some embodiments, the thickness of work function metal layer 136 is greater than the thickness of gate dielectric layer 134, as shown in FIG. 1H. The thickness of work function metal layer 136 and the thickness of gate dielectric layer 134 may be measured in a direction parallel to the top surface of substrate 102. In some embodiments, gate dielectric layer 134 has a thickness in a range from about 5 Å to about 15 Å. In some embodiments, work function metal layer 136 has a thickness in a range from about 50 Å to about 500 Å. In some embodiments, gate electrode layer 138 has a thickness in a range from about 5 Å to about 500 Å.

In some embodiments, gate dielectric layer 134 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$-$Al_2O_3$) alloy, or other applicable dielectric materials.

Work function metal layer 136 is formed over gate dielectric layer 134 in accordance with some embodiments. Work function metal layer 136 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Gate electrode layer 138 is formed over work function metal layer 136 in accordance with some embodiments. In some embodiments, gate electrode layer 138 is made of a conductive material, such as aluminum, copper, tungsten, titanium, tantulum, or other applicable materials. Gate dielectric layer 134, work function metal layer 136, and gate electrode layer 138 may be formed by any applicable process to any applicable thickness.

It should be noted that additional layers may be formed above and/or below gate dielectric layer 134, work function metal layer 136, and gate electrode layer 138, such as liner layers, interface layers, seed layers, adhesion layers, barrier layers, or the like. In addition, gate dielectric layer 134, work function metal layer 136, and gate electrode layer 138 may include more than one layer made of various materials.

Next, etching processes are performed to etch work function metal layer 136, gate dielectric layer 134, and gate electrode layer 138 and to form a hard mask structure over the etched gate structure 132' in accordance with some embodiments. FIGS. 2A to 2D are cross-sectional representations of various stages of forming semiconductor structure 100 shown in FIGS. 1I to 1L in accordance with some embodiments.

Figure 1I:
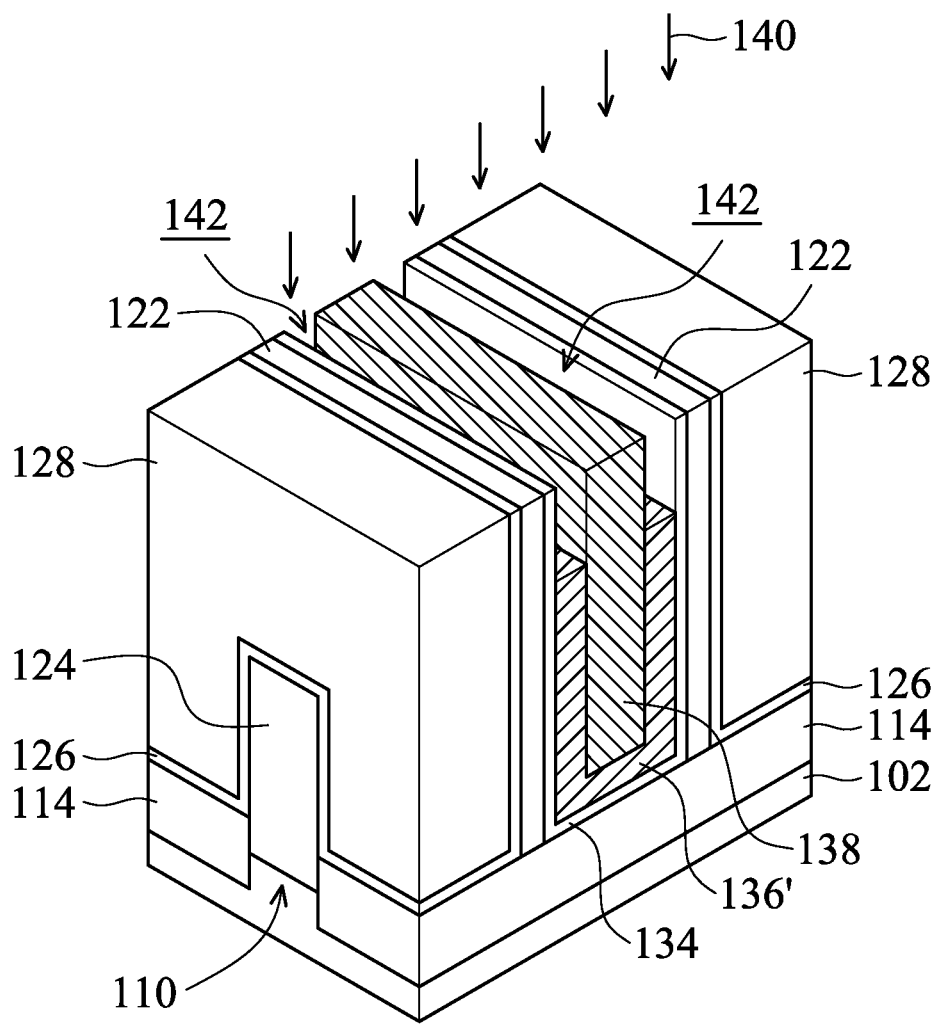
Figure 2A:
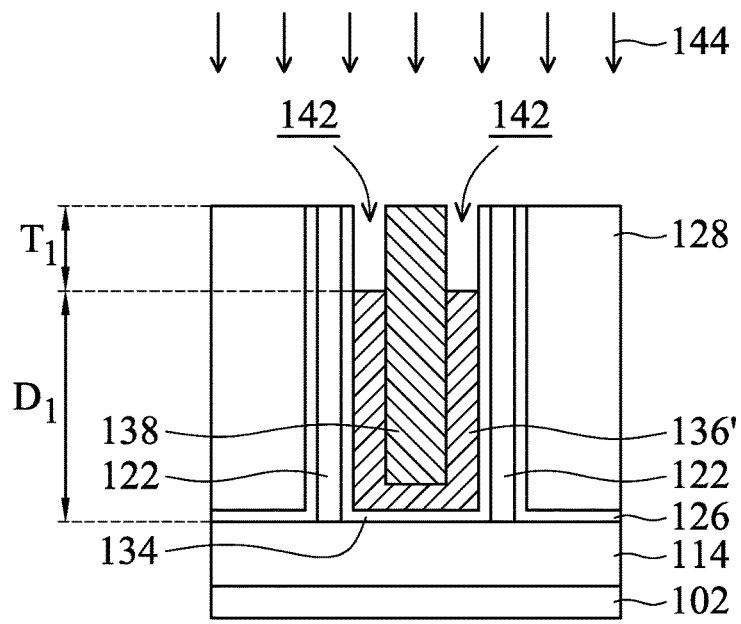
FIGS. 2A to 2D are cross-sectional representations of various stages of forming the semiconductor structure shown in FIGS. 1I to 1L in accordance with some embodiments.

More specifically, the top portions of work function metal layer 136 are removed to form etched work function metal layer 136', as shown in FIGS. 1I and 2A in accordance with some embodiments. In some embodiments, the top portions of work function metal layer 136 are removed by performing a first etching process 140. During first etching process 140, the top portions of work function metal layer 136 are removed to form first recesses 142 between gate dielectric layer 134 and gate electrode layer 138.

As shown in FIG. 2A, first recess 142 has a first thickness $T_1$, which is equal to the thickness of the top portion of work function metal layer 136 removed during first etching process 140. In some embodiments, the first thickness $T_1$ is in a range from about 10 nm to about 50 nm. If the first thickness $T_1$ is too large, the breakdown voltage of the resulting semiconductor structure may be affected due to too much of work function metal layer 136 being removed. On the other hand, if the first thickness $T_1$ is too small, the risk of a short circuit in the resulting semiconductor structure may be increased. Since work function metal layer 136 has a relatively large thickness, the removal of the top portion of work function metal layer 136 may be easier. Therefore, the distance $D_1$ between the top surface of etched work function metal layer 136' and the top surface of isolation structure 114 can be better controlled.

Figure 1J:
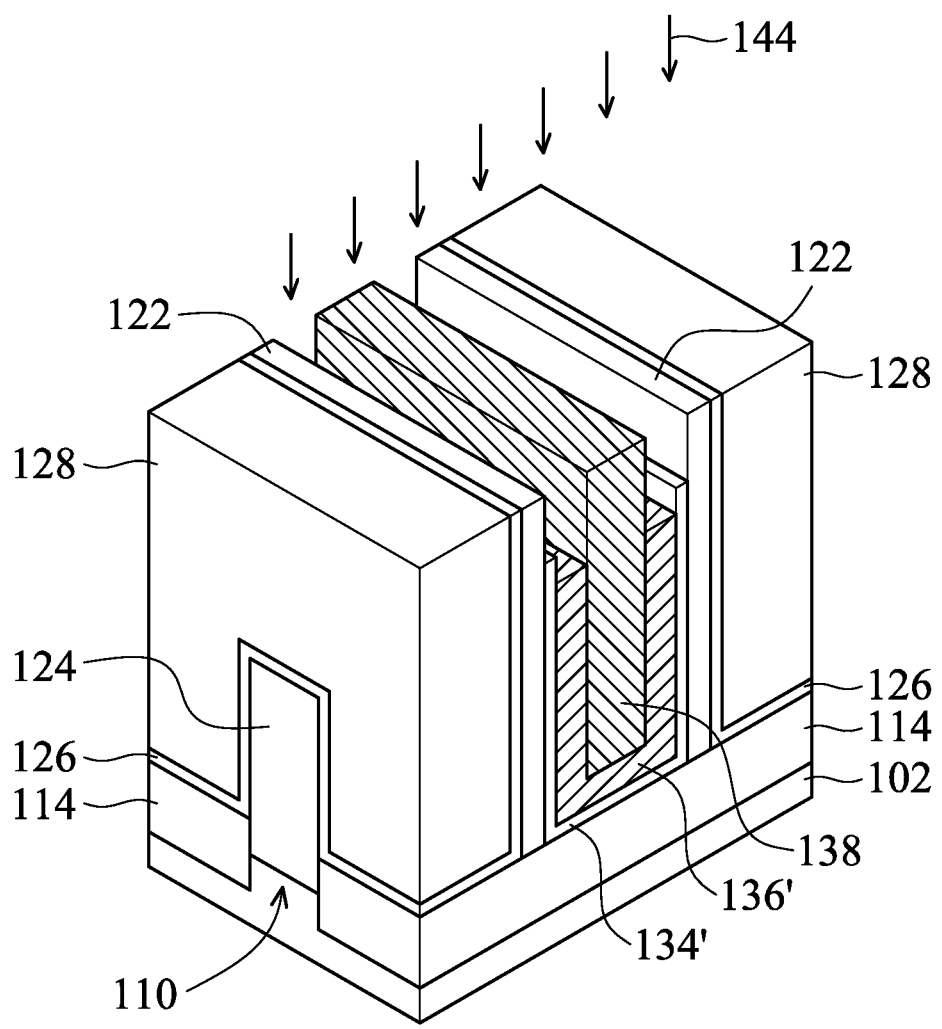
Figure 2B:
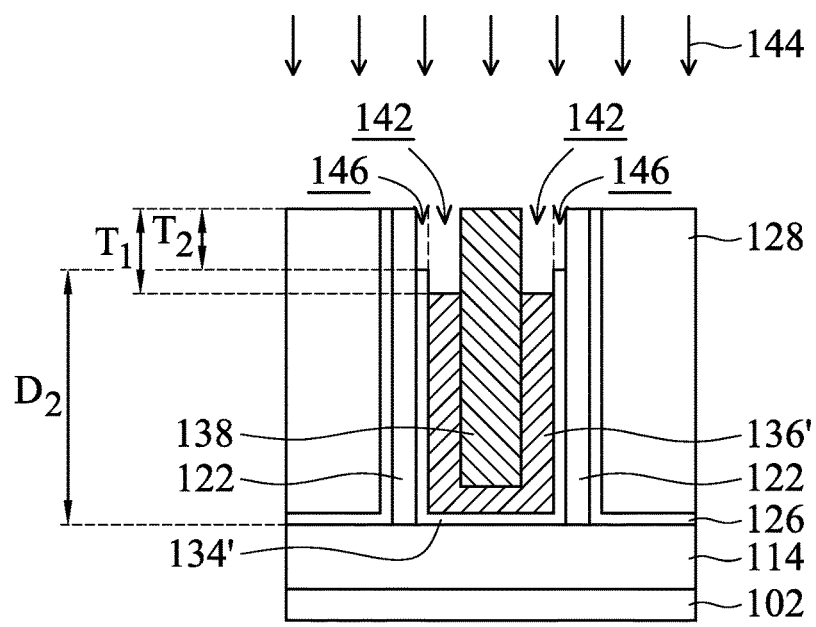

After the top portions of work function metal layer 136 are removed, the top portions of gate dielectric layer 134 are removed to form etched gate dielectric layer 134', as shown in FIGS. 1J and 2B in accordance with some embodiments. In some embodiments, the top portions of gate dielectric layer 134 are removed by performing a second etching process 144. In some embodiments, second etching process 144 is performed after first etching process 140 is performed. During second etching process 144, the top portions of gate dielectric layer 134 are removed to form second recesses 146.

As shown in FIG. 2B, second recess 146 has a second thickness $T_2$, which is equal to the thickness of the top portion of gate dielectric layer 134 removed during second etching process 144. In some embodiments, second thickness $T_2$ of second recess 146 is smaller than first thickness $T_1$ of first recess 142. It should be noted that second recess 146 is in the region where the top portion of gate dielectric layer 134 used to be located before second etching process 144 was performed. That is, the dot line shown in FIG. 2B is drawn to provide a better understanding of the structure, and there is no actual interface or boundary between first recess 142 and second recess 146.

In some embodiments, the second thickness $T_2$ is in a range from about 5 nm to about 50 nm. If the second thickness $T_2$ is too large, the breakdown voltage of the resulting semiconductor structure may be affected due to too much of gate dielectric layer 134 being removed. On the other hand, if the second thickness $T_2$ is too small, the risk of a short circuit in the resulting semiconductor structure may be increased.

As described previously, the top portion of work function metal layer 136 is first removed to form first recess 142 before the top portion of gate dielectric layer 134 is removed. As shown in FIG. 2B, a portion of gate dielectric layer 134 is exposed by first recess 142. In addition, since work function metal layer 136 has a relatively greater thickness (e.g. greater than the thickness of gate dielectric layer 134), the resulting first recess 142 also has a relatively great thickness. Accordingly, the removal of the top portion of gate dielectric layer 134 can become easier to control, and the distance $D_2$ between the top surface of etched gate dielectric layer 134' and the top surface of isolation structure 114 can be better controlled. In some embodiments, the distance $D_2$ is greater than the distance $D_1$.

Figure 1K:
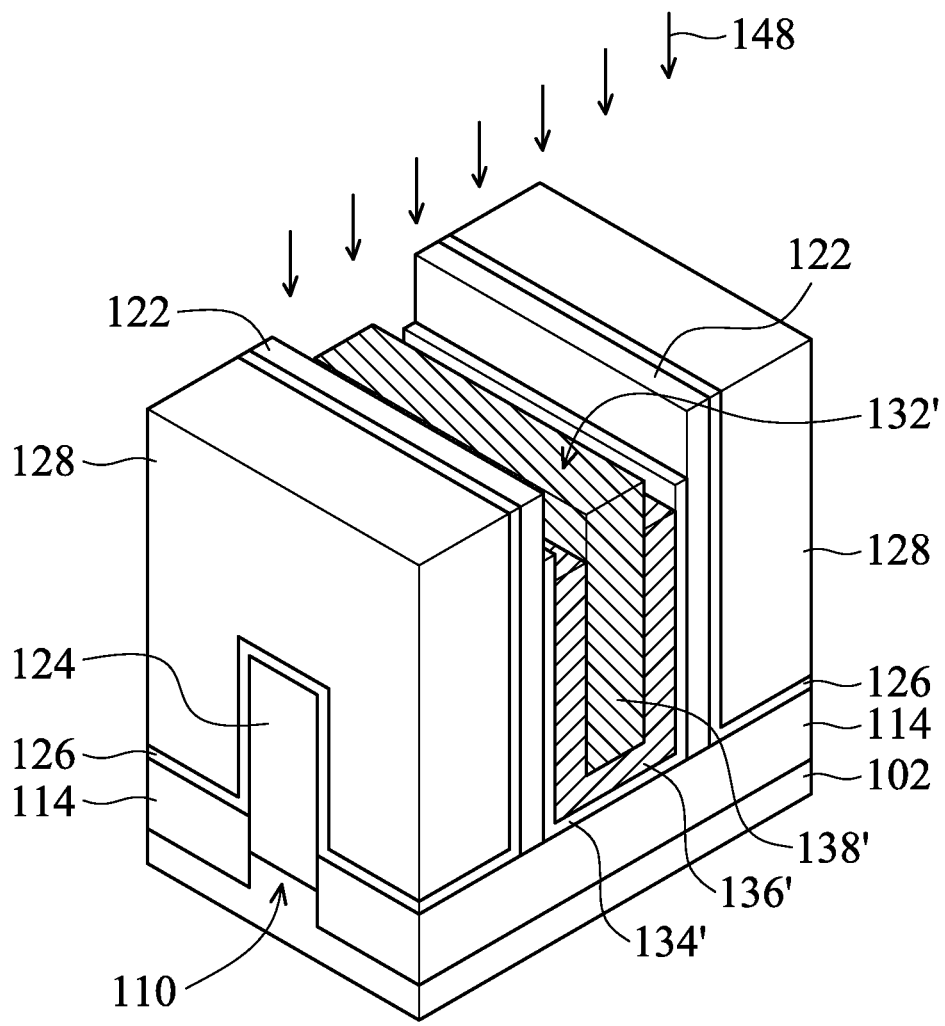
Figure 2C:
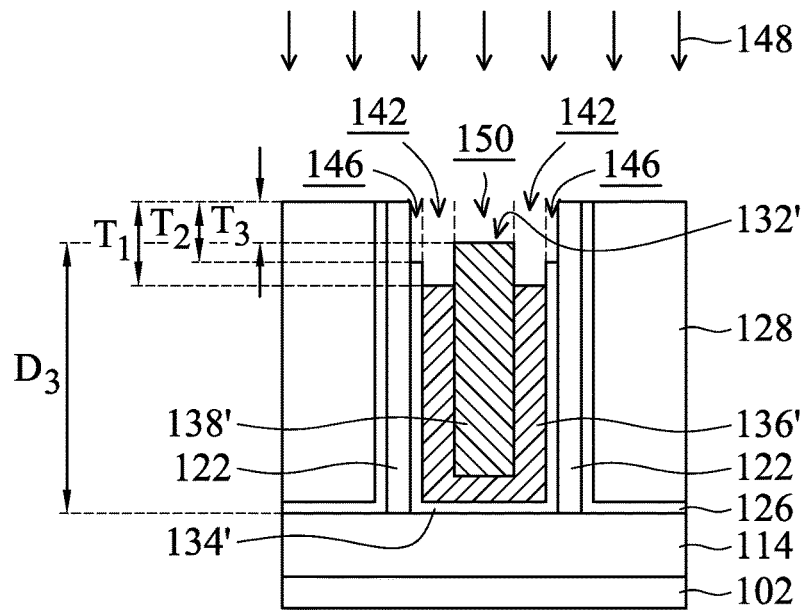

After the top portions of gate dielectric layer 134 are removed, the top portion of gate electrode layer 138 is removed to form an etched gate electrode layer 138', as shown in FIGS. 1K and 2C in accordance with some embodiments. In some embodiments, the top portion of gate electrode layer 138 is removed by performing a third etching process 148. In some embodiments, third etching process 148 is performed after second etching process 144 is performed. During third etching process 148, the top portion of gate electrode layer 138 is removed to form a third recess 150.

As shown in FIG. 2C, third recess 150 has a third thickness $T_3$, which is equal to the thickness of the top portion of gate electrode layer 138 removed during third etching process 148. In some embodiments, third thickness $T_3$ of third recess 150 is smaller than first thickness $T_1$ of first recess 142 and second thickness of second recess 146. It should be noted that third recess 150 is in the region where the top portion of gate electrode layer 138 used to be located before third etching process 148 was performed. That is, the dot line shown in FIG. 2C is drawn to provide a better understanding of the structure, but there is no actual interface or boundary between third recess 150 and first recess 142.

In some embodiments, the third thickness $T_3$ is in a range from about 0.1 nm to about 50 nm. If the third thickness $T_3$ is too large, the resistance of the resulting semiconductor structure may be too high. On the other hand, if the third thickness $T_3$ is too small, the risk of a short circuit in the resulting semiconductor structure may be increased. In addition, the distance $D_3$ between the top portion of etched gate electrode layer 138' and the top surface of isolation structure 114 may be better controlled. In some embodiments, the distance $D_3$ is greater than the distance $D_2$ and also greater than the distance $D_1$. In some embodiments, the ratio of distance $D_3$ to distance $D_1$ is in a range from about 1.1 to about 2.5. In some embodiments, the ratio of distance $D_3$ to distance $D_2$ is in a range from about 1.1 to about 2.5.

Figure 1L:
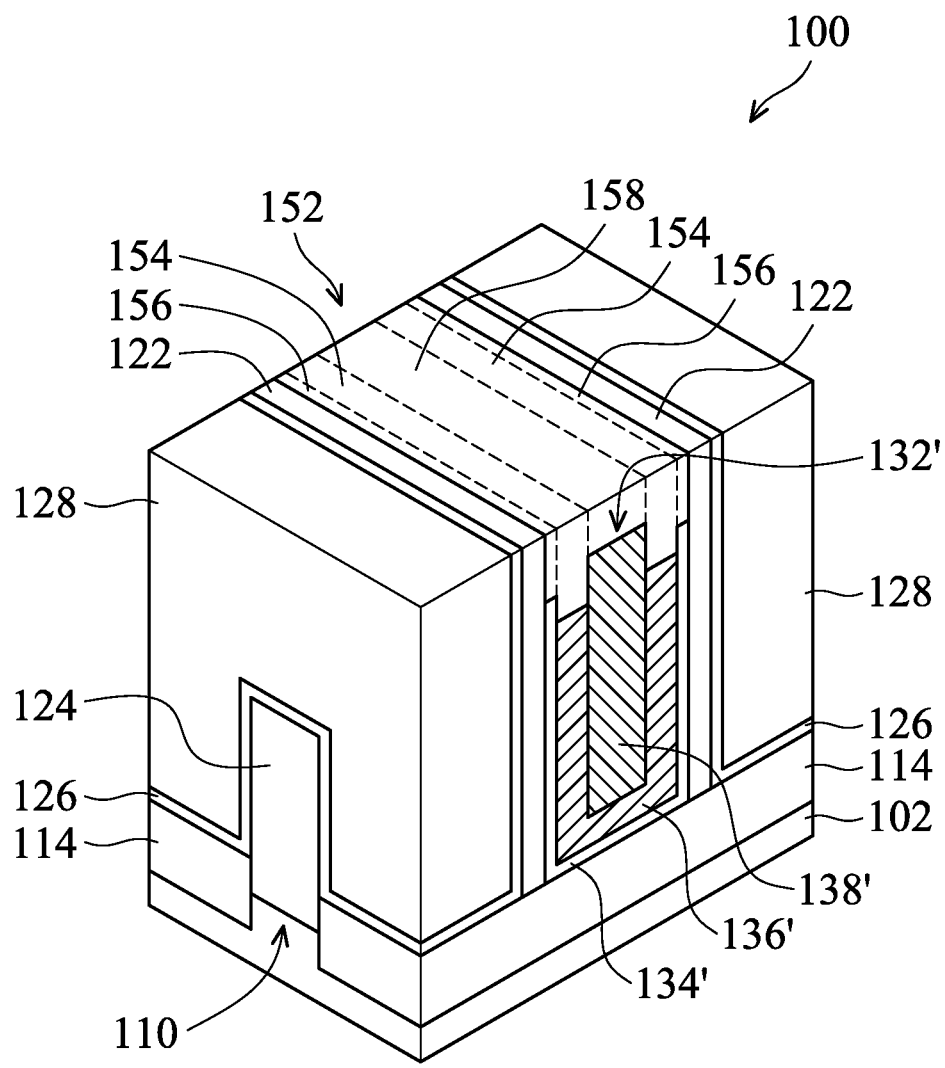
Figure 2D:
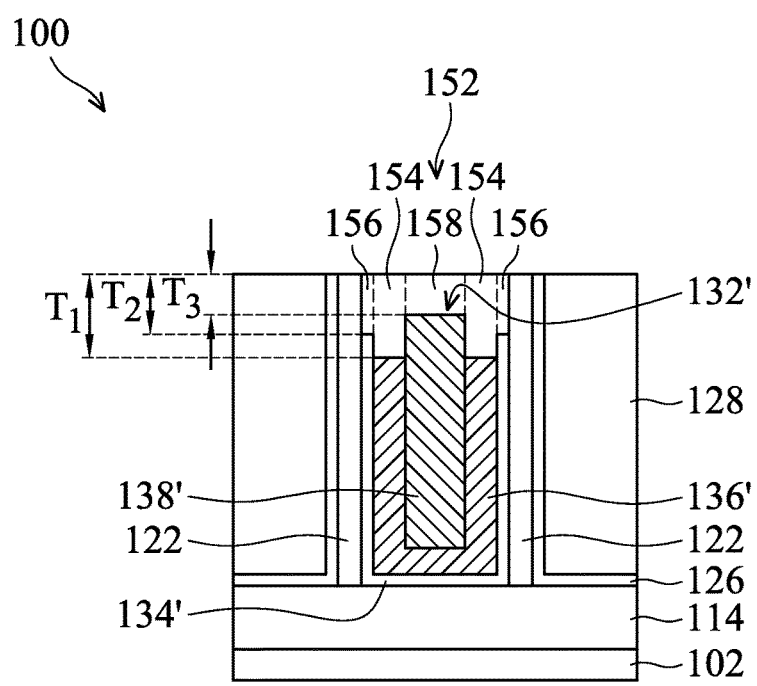

As shown in FIG. 2C, by removing the top portions of work function metal layer 136, gate dielectric layer 134, and gate electrode layer 138 having different thicknesses, the top surfaces of etched work function metal layer 136', etched gate dielectric layer 134', and etched gate electrode layer 138' are not level, and the bottom surface of the resulting recess, which is formed between spacers 122, is not flat, either. After the recess consisting of first recesses 142, second recesses 146, and third recess 150 is formed, a hard mask structure 152 is formed in the recess over the etched gate structure 132', as shown in FIGS. 1L and 2D in accordance with some embodiments. In some embodiments, hard mask structure 152 includes first portions 154, second portions 156, and a third portion 158, and the thicknesses of first portions 154, second portions 156, and third portion 158 of the hard mask structure 152 are different.

More specifically, first portions 154 of hard mask structure 152 are formed in first recesses 142 over etched work function metal layer 136'. That is, first portions 154 of hard mask structure 152 are in direct contact with the top surface of etched work function metal layer 136'. In addition, since first portions 154 of hard mask structure 152 are formed in first recesses 142, they have the same thickness. That is, first portion 154 of hard mask structure 152 also has a first thickness $T_1$. The first thickness $T_1$ may be measured in a direction vertical to the top surface of substrate 102. As described previously, if the first thickness $T_1$ is too large, the breakdown voltage of the resulting semiconductor structure may be affected due to too much of work function metal layer 136 being removed. On the other hand, if the first thickness $T_1$ is too small, the risk of a short circuit in the resulting semiconductor structure may be increased. As shown in FIG. 2D, the first thickness $T_1$ can also be seen as the distance between the top surface of hard mask structure 152 and the top surface of etched work function metal layer 136'.

Similarly, second portions 156 of hard mask structure 152 are formed in second recesses 146 over etched gate dielectric layer 134'. That is, second portions 156 of hard mask structure 152 are in direct contact with the top surface of etched gate dielectric layer 134'. In addition, since second portions 156 of hard mask structure 152 are formed in second recesses 146, they have the same thickness. That is, second portion 156 of hard mask structure 152 also has a second thickness $T_2$. The second thickness $T_2$ may be measured in a direction vertical to the top surface of substrate 102. As described previously, if the second thickness $T_2$ is too large, the breakdown voltage of the resulting semiconductor structure may be affected due to too much of gate dielectric layer 134 being removed. On the other hand, if the second thickness $T_2$ is too small, the risk of a short circuit in the resulting semiconductor structure may be increased. As shown in FIG. 2D, the second thickness $T_2$ can also be seen as the distance between the top surface of hard mask structure 152 and the top surface of etched gate dielectric layer 134'. In addition, the first thickness $T_1$ of first portion 154 is thicker than the second thickness $T_2$ of second portion 156.

Third portion 158 of hard mask structure 152 is formed in third recesses 150 over etched gate electrode layer 138'. That is, third portion 158 of hard mask structure 152 is in direct contact with the top surface of etched gate electrode layer 138'. In addition, since third portion 158 of hard mask structure 150 is formed in third recess 152, they have the same thickness. That is, third portion 158 of hard mask structure 152 also has a third thickness $T_3$. The third thickness $T_3$ may be measured in a direction vertical to the top surface of substrate 102. As described previously, if the third thickness $T_3$ is too large, the resistance of the resulting semiconductor structure may be too high. On the other hand, if the third thickness $T_3$ is too small, the risk of a short circuit in the resulting semiconductor structure may be increased. As shown in FIG. 2D, the third thickness $T_3$ can also be seen as the distance between the top surface of hard mask structure 152 and the top surface of etched gate electrode layer 138'. In addition, the second thickness $T_2$ of second portion 156 is thicker than the third thickness $T_3$ of third portion 158.

In some embodiments, the difference between third thickness $T_3$ and first thickness $T_1$ is in a range from about 0.1 nm to about 10 nm. As shown in FIG. 2D, the difference between third thickness $T_3$ and first thickness $T_1$ can be seen as the distance between the top surface of etched gate electrode layer 138' and the top surface of etched work function metal layer 136'. In some embodiments, the difference between third thickness $T_3$ and second thickness $T_2$ is in a range from about 0.1 nm to about 10 nm. In some embodiments, the difference between second thickness $T_2$ and first thickness $T_1$ is in a range from about 0.1 nm to about 5 nm. As shown in FIG. 2D, the difference between second thickness $T_2$ and first thickness $T_1$ can be seen as the distance between the top surface of etched work function metal layer 136' and the top surface of etched gate dielectric layer 134'.

In some embodiments, hard mask structure 152 is formed by filling first recesses 142, second recesses 146, and third recess 150 with a dielectric material. In some embodiments, hard mask structure 152 is made of silicon nitride. Hard mask structure 152 may be formed by using low-pressure chemical vapor deposition (LPCVD) or plasma enhanced chemical vapor deposition (PECVD), although other deposition processes may also be used in some other embodiments.

As shown in FIG. 2D, semiconductor structure 100 includes etched gate structure 132' and hard mask structure 152 formed over etched gate structure 132'. In addition, hard mask structure 152 has an unleveled bottom surface. In some embodiments, an upper portion of etched gate electrode layer 138' is embedded in hard mask structure 152, while a bottom portion of etched gate electrode layer 138' is embedded in etched work function metal layer 136'. As shown in FIG. 2D, etched gate structure 132' has an unleveled top surface.

More specifically, in some embodiments, the top surface of etched gate electrode layer 138', which can also be seen as the bottom surface of third portion 158 of hard mask structure 152, is located at a position that is higher than the top surface of etched gate dielectric layer 134', which can also be seen as the bottom surface of second portion 156 of hard mask structure 152. In some embodiments, the top surface of etched gate dielectric layer 134', which can also be seen as the bottom surface of second portion 156 of hard mask structure 152, is located at a position that is higher than the top surface of etched work function metal layer 136', which can also be seen as the bottom surface of first portion 154 of hard mask structure 152.

As described previously, first recess 142 is first formed between gate dielectric layer 134 and gate electrode layer 138 and has a relatively great thickness. Therefore, the removal of the top portion of gate dielectric layer 134, which has been at least partially exposed by first recess 142, can become easier. Accordingly, the top surface of etched gate dielectric layer 134' can be at a position that is lower than the top surface of etched gate electrode layer 138', and the risk of a short circuit between the etched gate dielectric layer 134' and a conductive structure formed nearby can be reduced.

Figure 3A:
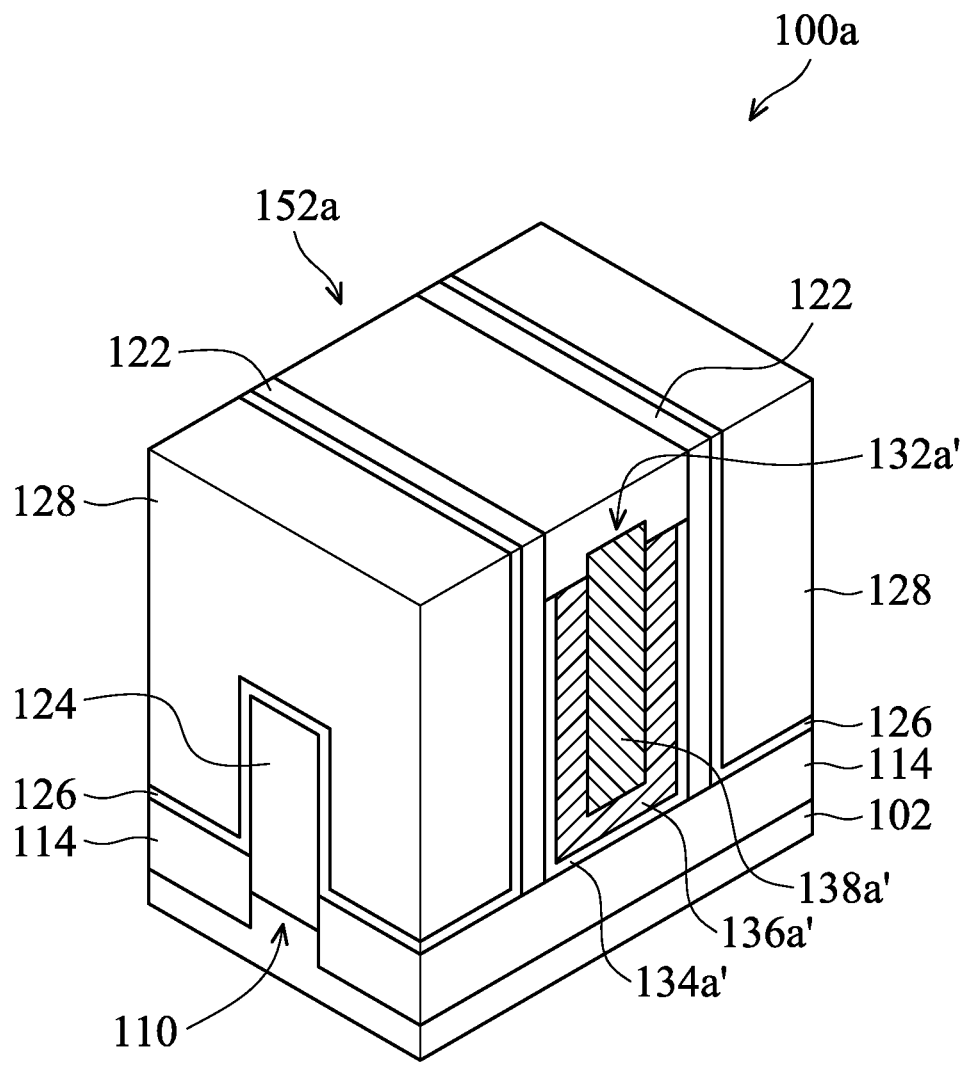
FIG. 3A is a perspective view of a semiconductor structure in accordance with some embodiments.
Figure 3B:
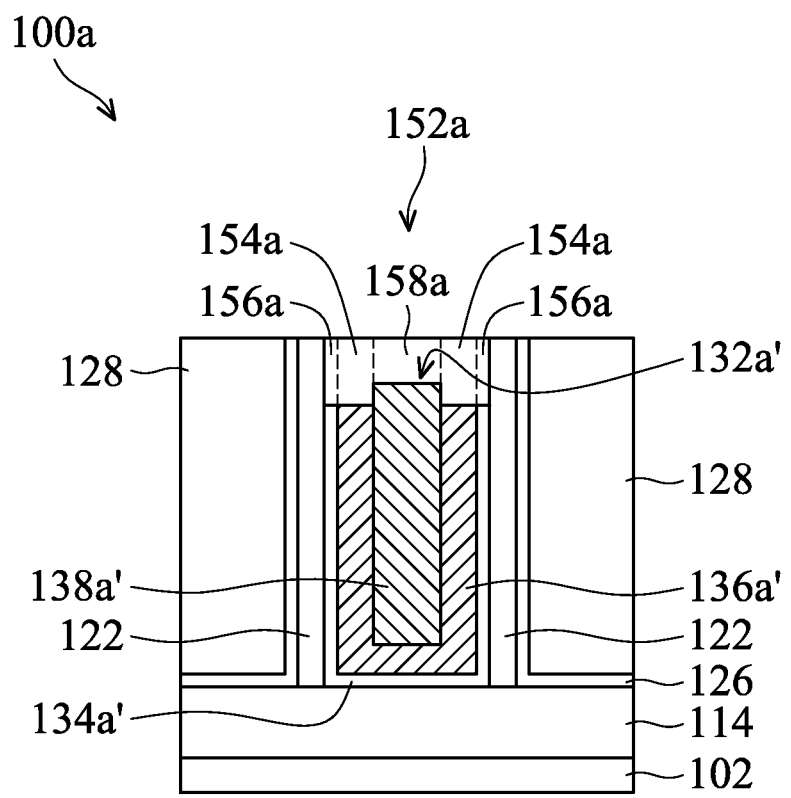
FIG. 3B is a cross-sectional presentation of the semiconductor structure shown in FIG. 3A in accordance with some embodiments.

FIG. 3A is a perspective view of a semiconductor structure 100a in accordance with some embodiments. FIG. 3B is a cross-sectional representation of semiconductor structure 100a shown in FIG. 3A in accordance with some embodiments. Semiconductor structure 100a is similar to, or the same as, semiconductor structure 100 shown in FIGS. 1L and 2D, except the top surfaces of an etched gate dielectric layer 134a' and an etched work function metal layer 136a' are level. Processes and materials used to form semiconductor structure 100a may be similar to, or the same as, those used to form semiconductor structure 100 and are not repeated herein.

More specifically, semiconductor structure 100a includes an etched gate structure 132a' formed across fin structure 100 over substrate 102 and hard mask structure 152a formed over etched gate structure 132a', as shown in FIG. 3A in accordance with some embodiments. Etched gate structure 132a' includes etched gate dielectric layer 134a', etched work function metal layer 136a' formed over etched gate dielectric layer 134a', and etched gate electrode layer 138a' formed over etched work function metal layer 136a'. In addition, the top surface of etched gate electrode layer 138a' is located at a position that is higher than that of the top surface of etched work function metal layer 136a', and the top surfaces of etched work function metal layer 136a' and etched gate dielectric layer 134a' are level in accordance with some embodiments.

Accordingly, the thicknesses of first portions 154a and second portions 156a of hard mask structure 152a are substantially equal, while the thickness of a third portion 158a of hard mask structure 152a is thicker than those of first portions 154a and second portions 156a.

However, although etched gate dielectric layer 134a' and etched work function metal layer 136a' are substantially level, the processes used to form etched gate structure 132a' may also be the same as, or similar to, those shown in FIGS. 1I to 1K. That is, the top portion of a work function metal layer is etched and removed to form a first recess over etched work function metal layer 136a', and the top portion of a gate dielectric layer is etched and removed afterwards. Since the gate dielectric layer is etched after the first recess is formed, it will be easier to completely remove the top portion of the gate dielectric layer without leaving some residue over spacers 122. Accordingly, the height of gate dielectric layer 134a can be better controlled and the risk of a short circuit can be reduced.

Figure 4:
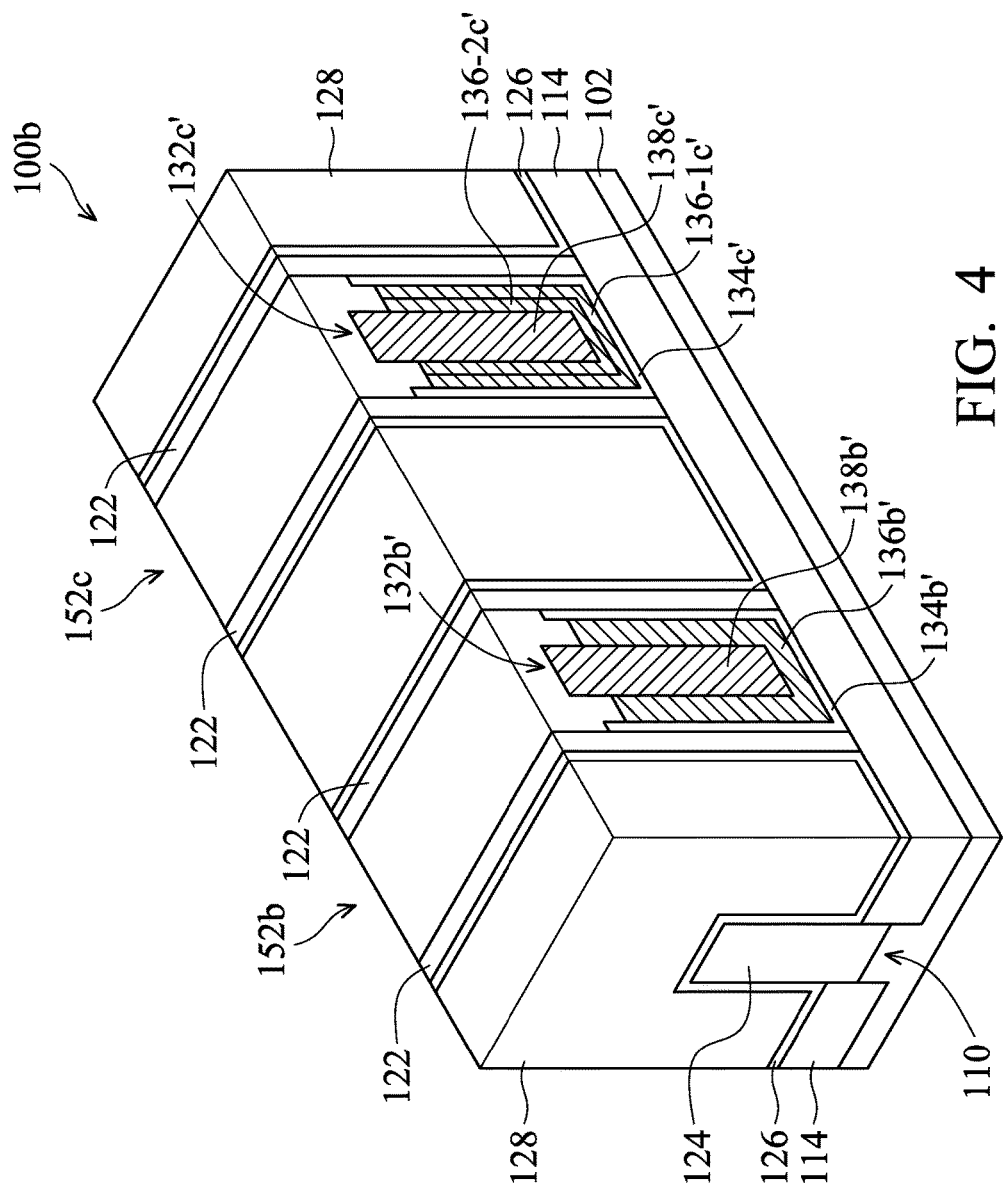
FIG. 4 is a perspective view of a semiconductor structure in accordance with some embodiments.

FIG. 4 is a perspective view of a semiconductor structure 100b in accordance with some embodiments. Some processes and materials used to form semiconductor structure 100b are similar to, or the same as, those used to form semiconductor structure 100 and are not repeated herein.

More specifically, semiconductor structure 100b includes a first etched gate structure 132b' and a second etched gate structure 132c' formed across fin structure 100 over substrate 102 and a first hard mask structure 152b and a second hard mask structure 152c respectively formed over first etched gate structure 132b' and second etched gate structure 132c', as shown in FIG. 4 in accordance with some embodiments.

First etched gate structure 132b' includes an etched gate dielectric layer 134b', an etched work function metal layer 136b' formed over etched gate dielectric layer 134b', and an etched gate electrode layer 138b' formed over etched work function metal layer 136b'. In addition, the top surface of etched gate electrode layer 138b' is located at a position that is higher than that of the top surface of etched gate dielectric layer 134b', and the top surface of etched gate dielectric layer 134b' is located at a position that is higher than that of the top surface of etched work function metal layer 136b' in accordance with some embodiments.

Second etched gate structure 132c' includes an etched gate dielectric layer 134c', etched work function metal layers 136-1c' and 136-2c' formed over etched gate dielectric layer 134c', and etched gate electrode layer 138c' formed over etched work function metal layer 136-2c'. In addition, the top surface of etched gate electrode layer 138c' is located at a position that is higher than that of the top surface of etched gate dielectric layer 134c', and the top surface of etched gate dielectric layer 134c' is located at a position that is higher than that of the top surfaces of etched work function metal layers 136-1c' and 136-2c' in accordance with some embodiments.

In some embodiments, work function metal layer 136b and work function metal layers 136-1c and 136-2c are made of different materials. In some embodiments, first etched gate structure 132b' is an n-type gate structure, and second etched gate structure 132c' is a p-type gate structure. In some embodiments, first etching process 140, as shown in FIG. 2A and described previously, is performed to form first recesses over etched work function metal layers 136b', 136-1c', and 136-2c'. Afterwards, second etching process 144, as shown in FIG. 2B and described previously, is performed to form second recesses over etched gate dielectric layers 134b' and 134c'. As described previously, since the gate dielectric layers are etched after the first recesses are formed, it will be easier to completely remove the top portions of the gate dielectric layers without leaving some residue over spacers 122. Accordingly, the height of etched gate dielectric layers 134b' and 134c' can be better controlled and the risk of a short circuit can be reduced.

Generally, the top portion of a gate structure is removed to form a hard mask structure over the etched gate structure (e.g. etched gate structure 132', 132a' and 132b'). When the gate structure includes a gate dielectric layer, a work function metal layer, and a gate electrode layer, and top portions of them may be removed by performing different etching processes.

However, since gate dielectric layer (e.g. gate dielectric layer 134) is relatively thin, the removal of the top portion of the gate dielectric layer may be challenging. For example, some residues may remain on the sidewalls of the spacers (e.g. spacers 122), resulting in increasing the risk of a short circuit between the gate dielectric layer and the conductive structure formed nearby. Accordingly, in some embodiments, before the top portion of gate dielectric layer 134 is removed, first etching process 140 is first performed to remove the top portion of work function metal layer 136 and to form first recess 142 over etched work function metal layer 136'. The top portion of gate dielectric layer 134 is removed afterwards. That is, the top portion of gate dielectric layer 134 is removed after first recess 142 is formed.

Since the thickness of work function metal layer 136 is greater than that of gate dielectric layer 134, the removal of the top portion of work function metal layer is relatively easier. In addition, the resulting first recess 142 may has a relatively great thickness. Accordingly, when the top portion of gate dielectric layer 134 is removed, a portion of gate dielectric layer 134 has been exposed by first recess 142, and therefore the removal of the top portion of gate dielectric layer 134, which has a relatively small thickness, can become easier. As a result, the risk of a short circuit can be reduced, and the reliability of the manufacturing processes can be improved.

Embodiments of a semiconductor structure and methods for forming the semiconductor structures are provided. The semiconductor structure includes a gate structure and a hard mask structure formed over the gate structure. The gate structure further includes a gate dielectric layer, a work function metal layer, and a gate electrode layer. The top surface of the gate electrode layer is located at a position that is higher than the top surface of the gate dielectric layer, so that the risk of a short circuit can be prevented.

In some embodiments, a semiconductor structure is provided. The semiconductor structure includes a fin structure formed over a substrate and a gate structure formed across the fin structure. In addition, the gate structure includes a gate dielectric layer formed over the substrate and a work function metal layer formed over the gate dielectric layer. The gate structure further includes a gate electrode layer formed over the work function metal layer. In addition, a top surface of the gate electrode layer is located at a position that is higher than that of a top surface of the gate dielectric layer, and the top surface of the gate dielectric layer is located at a position that is higher than that of a top surface of the work function layer.

In some embodiments, a semiconductor structure is provided. The semiconductor structure includes a fin structure formed over a substrate and a gate structure formed across the fin structure. In addition, the gate structure includes a gate dielectric layer formed over the substrate and a work function metal layer formed over the gate dielectric layer. The gate structure further includes a gate electrode layer formed over the work function metal layer. The semiconductor structure further includes a hard mask structure formed over the gate structure. In addition, the hard mask structure comprises a first portion formed over the work function metal layer, a second portion formed over the gate dielectric layer, and a third portion formed over the gate electrode layer, and the thicknesses of the first portion, the second portion, and the third portion of the hard mask structure are different.

In some embodiments, a method for manufacturing a semiconductor structure is provided. The method for manufacturing a semiconductor structure includes forming a fin structure over a substrate and forming a dummy gate structure across the fin structure. The method for manufacturing a semiconductor structure further includes forming spacers on sidewalls of the dummy gate structure and removing the dummy gate structure to form a trench between the spacers. The method for manufacturing a semiconductor structure further includes forming a gate dielectric layer on sidewalls and a bottom surface of the trench and forming a work function metal layer over the gate dielectric layer. The method for manufacturing a semiconductor structure further includes forming a gate electrode layer over the work function metal layer and removing a top portion of the work function metal layer to form an etched work function metal layer. The method for manufacturing a semiconductor structure further includes removing a top portion of the gate dielectric layer to form an etched gate dielectric layer after the top portion of the work function metal layer is removed and removing a top portion of the gate electrode layer to form an etched gate electrode layer after the top portion of the gate dielectric layer is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming spacers over a substrate;
    forming a trench between the spacers;
    forming a gate dielectric layer on sidewalls and a bottom surface of the trench;
    forming a work function metal layer over the gate dielectric layer;
    forming a gate electrode layer over the work function metal layer;
    removing a top portion of the work function metal layer located between the gate dielectric layer and the gate electrode layer to form an etched work function metal layer such that a top surface of the work function metal layer becomes lower than a top surface of the gate dielectric layer while the top surface of the gate dielectric layer is substantially level with a top surface of the gate electrode layer;
    removing a top portion of the gate dielectric layer to form an etched gate dielectric layer after the top portion of the work function metal layer is removed, such that the top surface of the gate dielectric layer becomes lower than the top surface of the gate electrode layer; and
    removing a top portion of the gate electrode layer to form an etched gate electrode layer after the top portion of the gate dielectric layer is removed,
    wherein the thickness of the work function metal layer is greater than the thickness of the gate dielectric layer.

2. The method for manufacturing a semiconductor structure as claimed in claim 1, wherein the top portion of the work function layer is removed by performing a first etching process, and a first recess is formed between the gate electrode layer and the gate dielectric layer after the first etching process.

3. The method for manufacturing a semiconductor structure as claimed in claim 2, wherein the top portion of the gate dielectric layer is removed to form a second recess by performing a second etching process, and the top portion of the gate electrode layer is removed to form a third recess by performing a third etching process.

4. The method for manufacturing a semiconductor structure as claimed in claim 3, further comprising
    filling the first recess, the second recess, and the third recess with a dielectric material to form a hard mask structure over the etched gate electrode layer, the etched work function metal layer, and the etched gate dielectric layer.

5. The method for manufacturing a semiconductor structure as claimed in claim 3, wherein the top portion of the work function metal layer removed by the first etching process has a first thickness, the top portion of the gate dielectric layer removed by the second etching process has a second thickness, and the top portion of the gate electrode layer removed by the third etching process has a third thickness, and the first thickness, the second thickness, and the third thickness are different.

6. The method for manufacturing a semiconductor structure as claimed in claim 1, further comprising:
    forming a hard mask structure comprising a first portion, a second portion, and a third portion, wherein the first portion of the hard mask structure is formed over the etched work function metal layer, the second portion of the hard mask structure is formed over the etched gate dielectric layer, and the third portion of the hard mask structure is formed over the etched gate electrode layer, and the thicknesses of the first portion, the second portion, and the third portion of the hard mask structure are different.

7. A method for manufacturing a semiconductor structure, comprising:
forming a metal gate structure over a substrate, the metal gate structure comprising:
a gate dielectric layer;
a work function metal layer formed over the gate dielectric layer; and
a gate electrode layer formed over the work function metal layer, removing a top portion of the work function metal layer; and
removing a top portion of the gate dielectric layer after the top portion of the work function metal layer is removed;
removing a top portion of the gate electrode layer after the top portion of the gate dielectric layer is removed; and
forming a hard mask structure covering the gate electrode layer, the work function metal layer, and the gate dielectric layer, wherein the bottom surface of the hard mask structure is not flat and the hard mask structure is made of a dielectric material.

8. The method for manufacturing a semiconductor structure as claimed in claim 7, wherein a first recess is formed after the top portion of the work function metal layer is removed, and a sidewall of the gate dielectric layer is exposed by the first recess.

9. The method for manufacturing a semiconductor structure as claimed in claim 7, wherein a portion of the gate electrode layer extends into the hard mask structure.

10. The method for manufacturing a semiconductor structure as claimed in claim 9, wherein after the hard mask structure is formed, a top surface of the gate electrode layer is located at a position that is higher than that of a top surface of the gate dielectric layer, and the top surface of the gate dielectric layer is located at a position that is higher than that of a top surface of the work function metal layer.

11. The method for manufacturing a semiconductor structure as claimed in claim 7, wherein a top surface of the gate dielectric layer, a top surface of the work function metal layer, and a top surface of the gate electrode layer are substantially level before the top portion of the work function metal layer is removed.

12. The method for manufacturing a semiconductor structure as claimed in claim 7, wherein the top portion of the work function layer is removed by performing a first etching process, and a first recess is formed between the gate electrode layer and the gate dielectric layer after the first etching process is performed.

13. The method for manufacturing a semiconductor structure as claimed in claim 12, wherein the top portion of the gate dielectric layer is removed to form a second recess by performing a second etching process.

14. The method for manufacturing a semiconductor structure as claimed in claim 13, wherein the top portion of the gate electrode layer is removed to form a third recess by performing a third etching process.

15. A method for manufacturing a semiconductor structure, comprising:
forming a metal gate structure over a substrate, the metal gate structure comprising:
a gate dielectric layer;
a work function metal layer formed over the gate dielectric layer; and
a gate electrode layer formed over the work function metal layer,
removing a top portion of the work function metal layer to form a first trench exposing a top portion of the gate dielectric layer;
removing the top portion of the gate dielectric layer to form a second trench after the first trench is formed;
removing a top portion of the gate electrode layer to form a third trench after the second trench is formed: and
filling the first trench, the second trench, and the third trench with a dielectric material to form a hard mask structure, wherein the bottom surface of the hard mask structure is not flat.

16. The method for manufacturing a semiconductor structure as claimed in claim 15, wherein the first recess is formed between the gate dielectric layer and the gate electrode layer.

17. The method for manufacturing a semiconductor structure as claimed in claim 15, wherein a thickness of the first trench is greater than a thickness of the second trench, and the thickness of the second trench is greater than a thickness of the third trench.

18. The method for manufacturing a semiconductor structure as claimed in claim 15, wherein the hard mask structure comprises a first portion formed in the first trench over the work function metal layer, a second portion formed in the second trench over the gate dielectric layer, and a third portion formed in the third trench over the gate electrode layer, and the thickness of the first portion, the second portion, and the third portion of the hard mask structure are different.

19. The method for manufacturing a semiconductor structure as claimed in claim 15, wherein a portion of the gate electrode layer extends into the hard mask structure.

* * * * *